(12) United States Patent
Liu

(10) Patent No.: US 12,666,717 B2
(45) Date of Patent: Jun. 23, 2026

(54) DISPLAY PANEL AND MANUFACTURE METHOD THEREOF

(71) Applicant: TCL CHINA STAR OPTOELECTRONICS TECHNOLOGY CO., LTD., Shenzhen (CN)

(72) Inventor: Linfeng Liu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 1212 days.

(21) Appl. No.: 17/623,478

(22) PCT Filed: Dec. 22, 2021

(86) PCT No.: PCT/CN2021/140392
§ 371 (c)(1),
(2) Date: Jun. 22, 2023

(87) PCT Pub. No.: WO2023/108748
PCT Pub. Date: Jun. 22, 2023

(65) Prior Publication Data
US 2024/0047464 A1 Feb. 8, 2024

(30) Foreign Application Priority Data

Dec. 16, 2021 (CN) .......................... 202111544841.5

(51) Int. Cl.
*H10H 29/45* (2025.01)
*H10D 86/40* (2025.01)
(Continued)

(52) U.S. Cl.
CPC ........... *H10D 86/60* (2025.01); *H10D 86/411* (2025.01); *H10H 29/10* (2025.01); *H10H 29/45* (2025.01)

(58) Field of Classification Search
CPC .... H10H 29/45; H01L 25/0753; H01L 25/162
See application file for complete search history.

(56) References Cited

U.S. PATENT DOCUMENTS

2008/0012476 A1 1/2008 Kim et al.
2014/0374742 A1 12/2014 Tsang
(Continued)

FOREIGN PATENT DOCUMENTS

CN 104281305 A 1/2015
CN 107871752 A 4/2018
(Continued)

OTHER PUBLICATIONS

Machine translation of CN 111769048 A (Year: 2020).*
(Continued)

*Primary Examiner* — Bryan R Junge
(74) *Attorney, Agent, or Firm* — PV IP PC; Christopher S. Ruprecht; Wei Te Chung

(57) ABSTRACT

The present application discloses a display panel and a manufacturing method thereof. The display panel comprises: a first substrate and a second substrate, and the first substrate is provided with a driving circuit; the second substrate is arranged corresponding to the first substrate, and an LED is provided on a side of the second substrate facing the first substrate, and the driving circuit is employed to drive the LED to emit light. The display panel provided by the present application can solve the abnormal display problem caused by the voltage drop when the power supply passes through the thin film transistor in the driving circuit.

18 Claims, 2 Drawing Sheets

(51) Int. Cl.
H10D 86/60      (2025.01)
H10H 29/10      (2025.01)

(56) References Cited

U.S. PATENT DOCUMENTS

| | | | |
|---|---|---|---|
| 2015/0009158 A1 | 1/2015 | Tsang | |
| 2019/0148409 A1 | 5/2019 | Bang | |
| 2019/0371779 A1* | 12/2019 | Yeon | H10H 20/8516 |
| 2020/0035748 A1* | 1/2020 | Xia | G02B 5/201 |
| 2020/0161281 A1* | 5/2020 | Hong | H10H 20/857 |
| 2020/0161282 A1* | 5/2020 | Kang | H01L 25/0753 |
| 2021/0217805 A1* | 7/2021 | Kusunoki | H10D 86/0214 |
| 2021/0327865 A1* | 10/2021 | Yamazaki | H10D 86/441 |
| 2022/0352246 A1* | 11/2022 | Choi | H10H 20/8312 |
| 2022/0367775 A1* | 11/2022 | Yamazaki | H10D 86/60 |
| 2023/0037052 A1* | 2/2023 | Choi | H10H 20/857 |
| 2023/0065336 A1* | 3/2023 | Cho | H10H 20/857 |

FOREIGN PATENT DOCUMENTS

| | | | | |
|---|---|---|---|---|
| CN | 110556455 A | | 12/2019 | |
| CN | 111769048 A | * | 10/2020 | ............... G09F 9/33 |
| KR | 20080057490 A | | 6/2008 | |

OTHER PUBLICATIONS

International Search Report in International application No. PCT/CN2021/140392, mailed on Sep. 14, 2022.

Written Opinion of the International Searching Authority in International application No. PCT/CN2021/140392, mailed on Sep. 14, 2022.

Chinese Office Action issued in corresponding Chinese Patent Application No. 202111544841.5 dated Jan. 15, 2025, pp. 1-6.

* cited by examiner

DISPLAY PANEL AND MANUFACTURE METHOD THEREOF

FIELD OF THE INVENTION

The present application relates to a display technology field, and more particularly to a display panel and a manufacturing method thereof.

BACKGROUND OF THE INVENTION

LEDs (Light Emitting Diodes) have been widely used in electronic equipment. High-density display devices composed of LEDs have the advantages of high brightness, high contrast and high resolution, and have already become one of the focuses in the display field. In a display driven by an LED paired with a thin film transistor, the LED is electrically connected to a driving circuit on the base substrate to drive the LED chip to emit light through the driving circuit.

In existing display panels, some structures need to use metal circuits, comprising thin film transistor electrodes, P electrodes and N electrodes of LEDs and power lines (VDD and VSS) for supplying power. Thin film transistor electrodes and LED P/N electrodes can adopt thinner metals less than 1 micrometer, but the power line needs to adopt as thick metal as possible, ranging from a few micrometers to tens of micrometers. Due to the low resistance of the structure with thick metal layer, the acceptable current is large, such as power lines; however, the structure with thin metal layers have higher resistance, which is prone to cause voltage loss and voltage drop, such as the thin film transistor electrodes.

In the existing display panels, the thin film transistor electrodes, the LED P/N electrodes and the power lines are integrated on one substrate. When the current output by the power line passes through the thin film transistor electrodes, it is easy to cause voltage loss and voltage drop problems, which lead to abnormal display of the display panel.

SUMMARY OF THE INVENTION

The embodiment of the present application provides a display panel and a manufacturing method thereof. The driving circuit and the power lines are respectively arranged on the upper and lower substrates and the two substrates are electrically connected. It can solve the abnormal display problem caused by the voltage drop when the power supply passes through the thin film transistor in the driving circuit.

First, the embodiment of the present application provides a display panel, comprising: a first substrate and a second substrate, and the first substrate is provided with a driving circuit, and the driving circuit comprises a thin film transistor and a scan signal line, and the thin film transistor comprises a gate, a source and a drain, and the scan signal line is electrically connected to the gate; the second substrate is arranged corresponding to the first substrate, and a first contact electrode, a second contact electrode and an LED is provided on a side of the second substrate facing the first substrate, and the first contact electrode is electrically connected with the source, and the second contact electrode is electrically connected with the drain, and the driving circuit is employed to drive the LED to emit light.

Optionally, in some embodiments of the present application, the second substrate further comprises a first driving signal line, electrically connected to the second contact electrode.

Optionally, in some embodiments of the present application, the LED comprises a first electrode, and the first electrode is electrically connected to the first contact electrode.

Optionally, in some embodiments of the present application, the LED comprises a first electrode, and the first electrode is electrically connected to the first contact electrode.

Optionally, in some embodiments of the present application, the first electrode and the second electrode are arranged on a same side.

Optionally, in some embodiments of the present application, the first substrate further comprises a third drive signal line, one end of the third drive signal line is electrically connected to the drain, and the other end of the third drive signal line is electrically connected to the first drive signal line.

The embodiment of the present application further provides another display panel, comprising: a first substrate and a second substrate, and the first substrate is provided with a driving circuit; the second substrate is arranged corresponding to the first substrate, and an LED is provided on a side of the second substrate facing the first substrate, and the driving circuit is employed to drive the LED to emit light.

Optionally, in some embodiments of the present application, the driving circuit comprises a thin film transistor, and the thin film transistor comprises a gate, a source and a drain; the second substrate is provided with a first contact electrode and a second contact electrode, the first contact electrode is electrically connected with the source, and the second contact electrode is electrically connected with the drain.

Optionally, in some embodiments of the present application, the second substrate further comprises a first driving signal line. The first driving signal line is electrically connected to the second contact electrode.

Optionally, in some embodiments of the present application, the LED comprises a first electrode, and the first electrode is electrically connected to the first contact electrode.

Optionally, in some embodiments of the present application, the LED further comprises a second electrode; the second substrate further comprises a second driving signal line, and the second driving signal line is electrically connected to the second electrode.

Optionally, in some embodiments of the present application, the first electrode and the second electrode are arranged on a same side.

Optionally, in some embodiments of the present application, the first substrate further comprises a third drive signal line, one end of the third drive signal line is electrically connected to the drain, and the other end of the third drive signal line is electrically connected to the first drive signal line.

Optionally, in some embodiments of the present application, the first substrate further comprises a scan signal line, and the scan signal line is electrically connected to the gate.

Second, the embodiment of the present application further provides a manufacturing method of a display panel, comprising steps of:

preparing a driving circuit on a first substrate; preparing an LED on a second substrate, wherein the driving circuit is employed to drive the LED to emit light; aligning the first substrate and the second substrate to form the display panel.

Optionally, in some embodiments of the present application, the driving circuit comprises a thin film transistor, and the thin film transistor comprises a gate, a source and a drain; a first contact electrode and a second contact electrode is prepared on the second substrate, the first contact electrode is electrically connected with the source, and the second contact electrode is electrically connected with the drain.

Optionally, in some embodiments of the present application, a first driving signal line is prepared on the second substrate, electrically connected to the second contact electrode.

Optionally, in some embodiments of the present application, the LED comprises a first electrode, and the first electrode is electrically connected to the first contact electrode.

Optionally, in some embodiments of the present application, the LED further comprises a second electrode; a second driving signal line is prepared on the second substrate, and the second driving signal line is electrically connected to the second electrode.

Optionally, in some embodiments of the present application, the first electrode and the second electrode are arranged on a same side.

The embodiment of the present application provides a display panel and a manufacturing method thereof. The display panel comprises a first substrate and a second substrate, and the first substrate is provided with a driving circuit; the second substrate is arranged corresponding to the first substrate, and an LED is provided on a side of the second substrate facing the first substrate, and the driving circuit is employed to drive the LED to emit light. In the display panel provided by the present application, the driving circuit and the power lines are respectively arranged on the upper and lower substrates and the two substrates are electrically connected. It can solve the abnormal display problem caused by the voltage drop when the power supply passes through the thin film transistor in the driving circuit.

BRIEF DESCRIPTION OF THE DRAWINGS

In order to more clearly illustrate the embodiments of the present application, the following figures will be described in the embodiments are briefly introduced. The drawings are merely some embodiments of the present application, those of ordinary skill in this field can obtain other figures according to these figures without paying the premise.

Wherein:

100/200 display panel, 10 first substrate, 20 driver circuit/thin film transistor, 21 source, 22 gate insulating layer, 23 active layer, 24 drain, 25 gate, 30 second substrate, 31 first contact electrode, 32 second contact electrode, 33 buffer layer, 34 interlayer dielectric layer, 40 LED, 41 first electrode, 42 second electrode, 50 first driving signal line, second driving signal line, 70 third driving signal line, 71 first sub-driving signal line, 72 second sub-driving signal line.

DETAILED DESCRIPTION OF PREFERRED EMBODIMENTS

For better explaining the technical solution and the effect of the present invention, the present invention will be further described in detail with the accompanying drawings in the specific embodiments. It is clear that the described embodiments are merely part of embodiments of the present application, but not all embodiments. Based on the embodiments of the present application, all other embodiments to those of skilled in the premise of no creative efforts obtained, should be considered within the scope of protection of the present application.

The embodiment of the present application provides a display panel and a manufacturing method thereof. The thin film transistors and the power lines are respectively arranged on the upper and lower substrates and the two substrates are electrically connected. It can solve the abnormal display problem caused by the voltage drop when the power supply passes through the thin film transistor in the driving circuit. It should be noted that the order of description in the following embodiments is not meant to limit the preferred order of the embodiments. In addition, in the description of this application, the term "comprising" means "comprising but not limited to". The terminologies "first", "second" and "third" are only used as labels for distinguishing different objects but not for describing the specific sequence.

Figure 1:
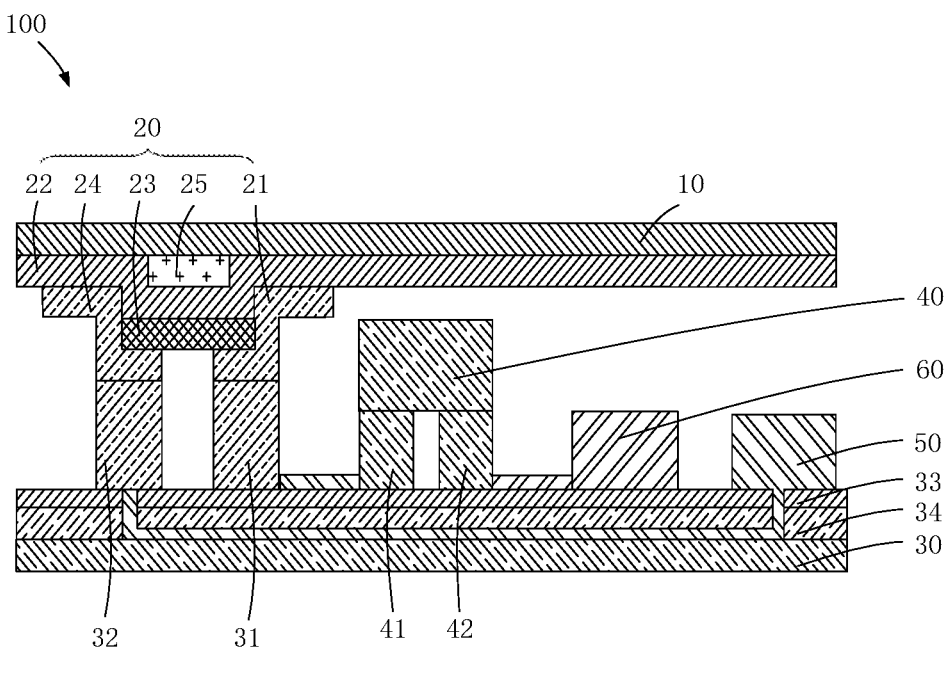
FIG. 1 is a structural diagram of a first display panel provided by an embodiment of the present application.

Please refer to FIG. 1, FIG. 1 is a structural diagram of a first display panel provided by an embodiment of the present application; as shown in FIG. 1, the embodiment of the present application provides a display panel 100. The display panel 100 comprises: a first substrate 10 and a second substrate 30, and the first substrate 10 is provided with a driving circuit 20; the second substrate 30 is arranged corresponding to the first substrate 10, and an LED 40 is provided on a side of the second substrate 30 facing the first substrate 10. The driving circuit 20 is employed to drive the LED 40 to emit light.

In the embodiment of the present application, preferably, the LED 40 is a Micro LED. Specifically, Micro LED chips possess the characteristics of small size, high integration and self-luminescence, etc. Compared with traditional display technology, it posses greater advantages in terms of brightness, resolution, contrast, energy consumption, service life, response speed and thermal stability.

Compared with the prior art, the thin film transistor electrodes and the power lines (VDD and VSS) for supplying power are integrated on one substrate, the thin film transistor electrodes need to use thinner metal, but power lines need to use as thick metal as possible. Because the metal layer of the power line is thick, the resistance is small, and the acceptable current is large, while the thin film transistor electrode with a thin metal layer has the larger resistance. The current output by the power line is prone to cause voltage loss and voltage drop problems as passing through the thin film transistor electrode, which lead to abnormal display of the display panel.

In the display panel 100 provided by the present application, the driving circuit 20 and the power lines are respectively arranged on the upper and lower substrates and the two substrates are electrically connected. It can solve the abnormal display problem caused by the voltage drop when the power supply passes through the thin film transistor in the driving circuit.

In the embodiment of the present application, the driving circuit 20 comprises a thin film transistor 20, and the thin film transistor 20 comprises a gate 25, a source 21 and a drain 24.

In the embodiment of the present application, a gate 25, a gate insulating layer 22, an active layer 23, a source 21 and a drain 24 are stacked on the side of the first substrate 10 facing the second substrate 30. The first substrate 10 further comprises a scan signal line (not shown in the figure), wherein the scan signal line and the gate 25 are electrically connected. The thin film transistor 20 in the embodiment of the present application may be a top gate oxide thin film transistor 20, or a top gate low temperature polysilicon thin film transistor 20 made by employing the top gate low temperature polysilicon technology, which is not limited in the present application.

In the embodiment of the present application, the second substrate 30 is provided with a first contact electrode 31 and a second contact electrode 32, the first contact electrode 31 is electrically connected with the source 21, and the second contact electrode 32 is electrically connected with the drain 24. Both the first contact electrode 31 and the second contact electrode 32 are made of conductive material, which can be the same material as the source 21 and the drain 24. The thickness range of the first contact electrode 31 and the second contact electrode 32 is from several micrometers to several tens of micrometers, which can be configured by those skilled in the art according to actual needs, which is not limited in this application.

In the embodiment of the present application, a buffer layer 33 is further disposed on the second substrate 30, and the first contact electrode 31 and the second contact electrode 32 are disposed on the buffer layer 33. Specifically, the first substrate 10 and the second substrate 30 may be glass substrates or flexible substrates made of high molecular polymers, and the high molecular polymers may be polyimide (PI). The buffer layer 33 can be silicon oxide layers (SiOx), silicon nitride layers (SiNx) or composite layers superimposed with the silicon oxide layers and the silicon nitride layers.

In the embodiment of the present application, the second substrate 30 further comprises a first driving signal line 50. The first driving signal line 50 is electrically connected to the second contact electrode 32. Preferably, the first driving signal line 50 is employed to provide a voltage driving signal (VDD). Specifically, the first driving signal line 50 is disposed on the buffer layer 33. The first driving signal line 50 is electrically connected to the second contact electrode 32 through a via hole (not shown in the figure) and provides the voltage driving signal (VDD) to the drain 24 of the thin film transistor 20. Furthermore, as shown in FIG. 1, the second substrate 30 further comprises an interlayer dielectric layer 34. Part of the first driving signal line 50 is located in the interlayer dielectric layer 34 and is electrically connected to the second contact electrode 32 through a via hole provided in the buffer layer 33.

In the embodiment of the present application, an LED 40 is provided on the buffer layer 33 of the second substrate 30, the LED 40 comprises a first electrode 41, and the first electrode 41 is electrically connected to the first contact electrode 31.

In the embodiment of the present application, the LED 40 further comprises a second electrode 42. The first electrode 41 and the second electrode 42 are insulated from each other. The second substrate 30 further comprises a second driving signal line 60, and the second driving signal line 60 is electrically connected to the second electrode 42. Preferably, the second driving signal line 60 is employed to provide a power switch signal (VSS) to the second electrode 42 of the LED 40. The specific type of the first electrode 41 is not limited in the embodiment of the present application. The first electrode 41 may be an N electrode, that is, a cathode. Correspondingly, the second electrode 42 is a P electrode, that is, an anode; besides, the first electrode 41 may be an P electrode, that is, an anode. Correspondingly, the second electrode 42 is an N electrode, that is, a cathode. Preferably, in FIG. 1, the first electrode 41 is a P electrode and the second electrode 42 is an N electrode.

In the embodiment of the present application, the LED 40 may be a transparent LED 40, that is, each layer structure of the LED 40 is formed by a transparent material. For instance, the N-type semiconductor layer or the P-type semiconductor layer can be made of transparent materials such as gallium nitride and gallium arsenide. The first electrode 41 and the second electrode 42 can also be formed of a transparent material. The specific material of the transparent material of forming the first electrode 41 and the second electrode 42 is not limited in this embodiment. It can be a transparent conductive material, such as ITO (Indium Tin Oxide), IZO (Indium Zinc Oxide), etc., or it can be a transparent ultra-thin metal materials, such as silver nanowires (each with a thickness of less than 100 nanometers), etc.

In the embodiment of the present application, the first electrode 41 and the second electrode 42 are arranged on the same side. Both the first electrode 41 and the second electrode 42 are arranged on the buffer layer 33. The LED 40 with electrode structure on the same side comprises a first type semiconductor layer (not shown in the figure), an active layer (not shown in the figure) and a second type semiconductor layer (not shown in the figure), the electrode 41 and the second electrode 42 that are stacked; the electrode 41 and the second electrode 42 are located on the same side with the LED semiconductor structure. The structure of the LED 40 comprises a LED semiconductor structure, and the electrode 41 and the second electrode 42 located on the same side of the LED semiconductor structure; specifically, in the preparation process of the electrode 41 and the second electrode 42, the first electrode 41 is located on the surface of the first type semiconductor layer away from the active layer, and then the first type semiconductor layer and the active layer are etched to expose part of the second type semiconductor layer. Then, the second electrode 42 is formed on the surface of the second type semiconductor layer facing the active layer, and ultimately the same-side electrode LED structure is formed.

In the display panel provided by the present application, the thin film transistor 20 is arranged on the first substrate 10, and the power line and the LED 40 are arranged on the second substrate 30. The source 21 and the drain 24 of the thin film transistor 20 are electrically connected to the first contact electrode 31 and the second contact electrode 32 on the second substrate 30 corresponding thereto, to realize the separate arrangement of the power line and other thin metal line signal lines to improve the stability of the display signal, and solve the abnormal display problem caused by the voltage drop when the power supply passes through the thin film transistor 20.

Figure 2:
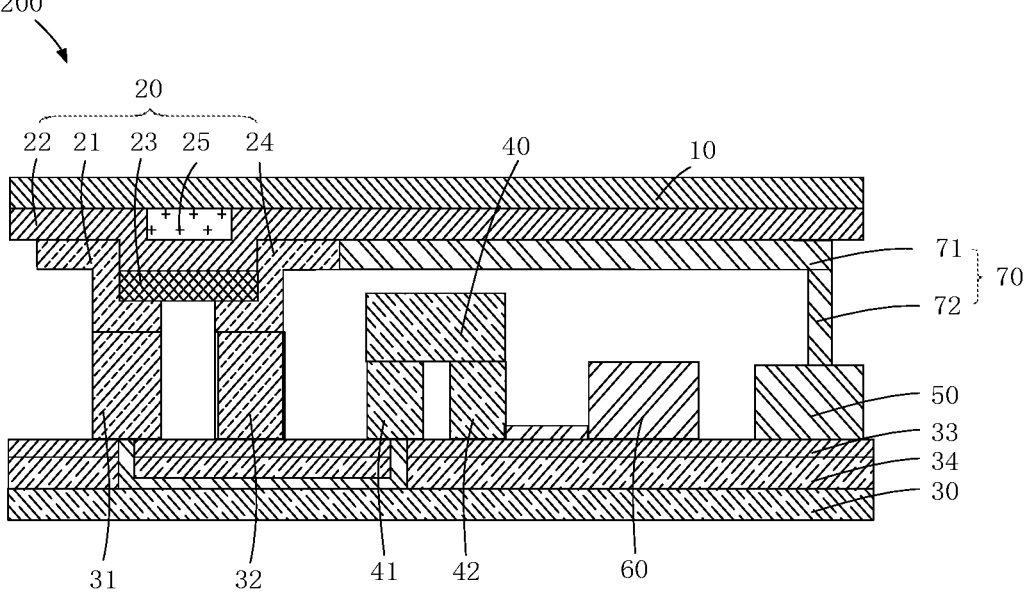
FIG. 2 is a structural diagram of a second display panel provided by an embodiment of the present application.

As a specific implementation of this application, please refer to FIG. 2. FIG. 2 is a structural diagram of a second display panel provided by an embodiment of the present application; as shown in FIG. 2, the difference between the display panel 200 and the display panel 100 is that the first substrate 10 in the display panel 200 further comprises a third driving signal line 70, one end of the third drive signal line 70 is electrically connected to the drain 24, and the other end of the third drive signal line 70 is electrically connected to the first drive signal line 50.

In the embodiment of the present application, the third driving signal line 70 comprises a first sub-driving signal line 71 and a second sub-driving signal line 72. The first sub-driving signal line 71 is arranged on the side of the first substrate 10 facing the second substrate 30, and the second sub-driving signal line 72 is arranged between the first substrate 10 and the second substrate 30. One end of the first sub-driving signal line 71 is electrically connected to the drain 24 of the thin film transistor 20, and the other end of the first sub-driving signal line 71 is electrically connected to one end of the second sub-driving signal line 72, and the other end of the second sub-driving signal line 72 is electrically connected to the first driving signal line 50.

As a specific implementation of this application, the third driving signal line 70 is arranged on the side of the first substrate 10 facing the second substrate 30. The display panel 200 further comprises a conductive structure (not shown in the figure), and the third driving signal line 70 is electrically connected to the first driving signal line 50 through the conductive structure. Specifically, the conductive structure may be a vertically-conducting conductive structure, that is, the conductive structure is conductive in a direction perpendicular to the first substrate 10. Optionally, the conductive structure comprises conductive metal balls and the like. Those skilled in the art can configure it according to actual needs, which is not limited in the embodiment of the present application.

In the embodiment of the present application, the 200 further comprises a first substrate 10 and a second substrate 30, and the first substrate 10 is provided with a driving circuit 20; the second substrate 30 is arranged corresponding to the first substrate 10, and an LED 40 is provided on a side of the second substrate 30 facing the first substrate 10. The driving circuit 20 is employed to drive the LED 40 to emit light.

In the embodiment of the present application, the driving circuit 20 comprises a thin film transistor 20, and the thin film transistor 20 comprises a gate 25, a source 21 and a drain 24. Specifically, in the embodiment of the present application, a gate 25, a gate insulating layer 22, an active layer 23, a source 21 and a drain 24 are stacked on the side of the first substrate 10 facing the second substrate 30. The first substrate 10 further comprises a scan signal line (not shown in the figure), wherein the scan signal line and the gate 25 are electrically connected. The thin film transistor 20 in the embodiment of the present application may be a top gate oxide thin film transistor 20, or a top gate low temperature polysilicon thin film transistor 20 made by employing the top gate low temperature polysilicon technology, which is not limited in the present application.

In the embodiment of the present application, the second substrate 30 is provided with a first contact electrode 31 and a second contact electrode 32, the first contact electrode 31 is electrically connected with the source 21, and the second contact electrode 32 is electrically connected with the drain 24. Both the first contact electrode 31 and the second contact electrode 32 are made of conductive material, which can be the same material as the source 21 and the drain 24. The thickness range of the first contact electrode 31 and the second contact electrode 32 is from several micrometers to several tens of micrometers, which can be configured by those skilled in the art according to actual needs, which is not limited in this application.

In the embodiment of the present application, a buffer layer 33 is further disposed on the second substrate 30, and the first contact electrode 31 and the second contact electrode 32 are disposed on the buffer layer 33. Specifically, the first substrate 10 and the second substrate 30 may be glass substrates or flexible substrates made of high molecular polymers, and the high molecular polymers may be polyimide (PI). The buffer layer 33 can be silicon oxide layers (SiOx), silicon nitride layers (SiNx) or composite layers superimposed with the silicon oxide layers and the silicon nitride layers.

In the embodiment of the present application, the second substrate 30 further comprises a first driving signal line 50. The first driving signal line 50 is electrically connected to the second contact electrode 32. Preferably, the first driving signal line 50 is employed to provide a voltage driving signal (VDD). Specifically, the first driving signal line 50 provides the voltage driving signal (VDD) to the drain 24 of the thin film transistor through the third driving signal line 70. Furthermore, as shown in FIG. 2, the second substrate 30 further comprises an interlayer dielectric layer 34. Part of the first driving signal line 50 is located in the interlayer dielectric layer 34 and electrically connects the source 21 of the thin film transistor 20 and the source 21 of the LED 40 through a via hole provided in the buffer layer 33.

In the embodiment of the present application, an LED 40 is provided on the buffer layer 33 of the second substrate 30, the LED 40 comprises a first electrode 41, and the first electrode 41 is electrically connected to the first contact electrode 31.

In the embodiment of the present application, the LED 40 further comprises a second electrode 42. The first electrode 41 and the second electrode 42 are insulated from each other. The second substrate 30 further comprises a second driving signal line and the second driving signal line 60 is electrically connected to the second electrode 42. Preferably, the second driving signal line 60 is employed to provide a power switch signal (VSS) to the second electrode 42 of the LED 40. The specific type of the first electrode 41 is not limited in the embodiment of the present application. The first electrode 41 may be an N electrode, that is, a cathode. Correspondingly, the second electrode 42 is a P electrode, that is, an anode; besides, the first electrode 41 may be an P electrode, that is, an anode. Correspondingly, the second electrode 42 is an N electrode, that is, a cathode. Preferably, in FIG. 2, the first electrode 41 is a P electrode and the second electrode 42 is an N electrode.

In the embodiment of the present application, the LED 40 may be a transparent LED 40, that is, each layer structure of the LED 40 is formed by a transparent material. For instance, the N-type semiconductor layer or the P-type semiconductor layer can be made of transparent materials such as gallium nitride and gallium arsenide. The first electrode 41 and the second electrode 42 can also be formed of a transparent material. The specific material of the transparent material of forming the first electrode 41 and the second electrode 42 is not limited in this embodiment. It can be a transparent conductive material, such as ITO (Indium Tin Oxide), IZO (Indium Zinc Oxide), etc., or it can be a transparent ultra-thin metal materials, such as silver nanowires (each with a thickness of less than 100 nanometers), etc.

In the embodiment of the present application, the first electrode 41 and the second electrode 42 are arranged on the same side. Both the first electrode 41 and the second electrode 42 are arranged on the buffer layer 33. The LED40 with electrode structure on the same side comprises a first type semiconductor layer (not shown in the figure), an active layer (not shown in the figure) and a second type semiconductor layer (not shown in the figure), the electrode 41 and the second electrode 42 that are stacked; the electrode 41 and the second electrode 42 are located on the same side with the LED semiconductor structure. The structure of the LED 40 comprises a LED semiconductor structure, and the electrode 41 and the second electrode 42 located on the same side of the LED semiconductor structure; specifically, in the preparation process of the electrode 41 and the second electrode 42, the first electrode 41 is located on the surface of the first type semiconductor layer away from the active layer, and then the first type semiconductor layer and the active layer are etched to expose part of the second type semiconductor layer. Then, the second electrode 42 is formed on the surface of the second type semiconductor layer facing the active layer, and ultimately the same-side electrode LED structure is formed.

In the display panel provided by the present application, the thin film transistor 20 is arranged on the first substrate 10, and the power line and the LED 40 are arranged on the second substrate 30. The source 21 and the drain 24 of the thin film transistor 20 are electrically connected to the first contact electrode 31 and the second contact electrode 32 on the second substrate 30 corresponding thereto, to realize the separate arrangement of the power line and other thin metal line signal lines to improve the stability of the display signal, and solve the abnormal display problem caused by the voltage drop when the power supply passes through the thin film transistor 20.

Figure 3:
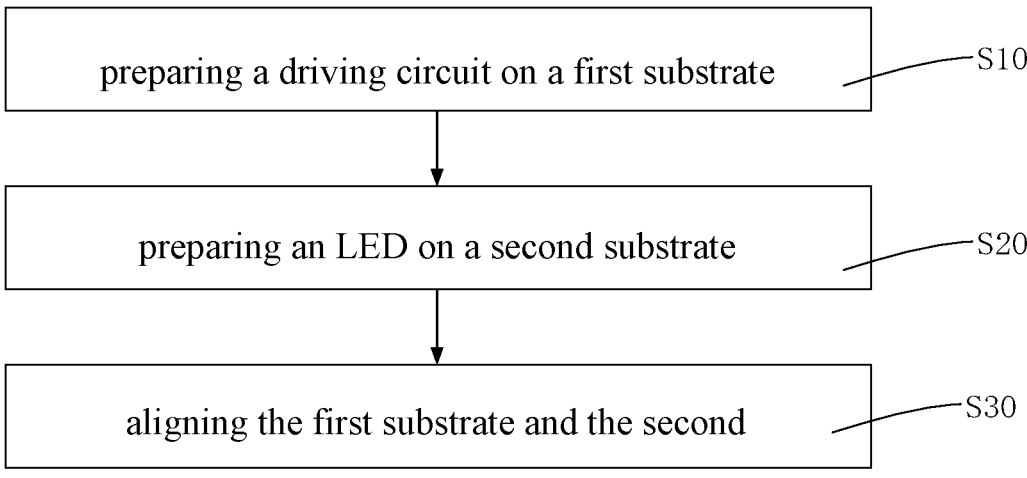
FIG. 3 is a diagram of a manufacturing process of a display panel provided by an embodiment of the present application.

Besides, please refer to FIG. 3. FIG. 3 is a diagram of a manufacturing process of a display panel provided by an embodiment of the present application. As shown in FIG. 3, the embodiment of the present application further provides a manufacturing method of a display panel, comprising steps of:

S10, preparing a driving circuit 20 on a first substrate 10.

In the embodiment of the present application, the drive circuit 20 is fabricated on the first substrate 10 by adopting a conventional process, wherein the driving circuit 20 comprises a thin film transistor 20, and the thin film transistor 20 comprises a gate 25, a source 21 and a drain 24. Specifically, in the embodiment of the present application, a gate 25, a gate insulating layer 22, an active layer 23, a source 21 and a drain 24 are stacked on the side of the first substrate 10 facing the second substrate 30. The first substrate 10 further comprises a scan signal line and a data signal line. The scan signal line is electrically connected to the gate 25. The data signal line is electrically connected to the source 21. The thin film transistor 20 in the embodiment of the present application may be a top gate oxide thin film transistor 20, or a top gate low temperature polysilicon thin film transistor 20 made by employing the top gate low temperature polysilicon technology, which is not limited in the present application.

S20, preparing an LED 40 on a second substrate 30.

In the embodiment of the present application, on the second substrate 30, the electrodes of the LED 40, the first driving signal line 50 (VDD) and the second driving signal line 60 (VSS) that provide the power supply voltage are made by electroplating or evaporation process, wherein the LED 40 comprises a first electrode 41 and a second electrode 42 disposed oppositely, and the first electrode 41 is electrically connected to the first contact electrode 31. The specific type of the first electrode 41 is not limited in the embodiment of the present application. The first electrode 41 may be an N electrode, that is, a cathode. Correspondingly, the second electrode 42 is a P electrode, that is, an anode; besides, the first electrode 41 may be an P electrode, that is, an anode. Correspondingly, the second electrode 42 is an N electrode, that is, a cathode. Preferably, in the embodiment of the present application, the first electrode 41 is a P electrode and the second electrode 42 is an N electrode.

In the embodiment of the present application, the first electrode 41 and the second electrode 42 are arranged on the same side. The LED40 with electrode structure on the same side comprises a first type semiconductor layer, an active layer and a second type semiconductor layer, the electrode 41 and the second electrode 42 that are stacked; the electrode 41 and the second electrode 42 are located on the same side with the LED semiconductor structure. The structure of the LED 40 comprises a LED semiconductor structure, and the electrode 41 and the second electrode 42 located on the same side of the LED semiconductor structure; specifically, in the preparation process of the electrode 41 and the second electrode 42, the first electrode 41 is located on the surface of the first type semiconductor layer away from the active layer, and then the first type semiconductor layer and the active layer are etched to expose part of the second type semiconductor layer. Then, the second electrode 42 is formed on the surface of the second type semiconductor layer facing the active layer, and ultimately the same-side electrode LED structure is formed.

Furthermore, a first contact electrode 31 and a second contact electrode 32 are prepared on the second substrate 30. Both the first contact electrode 31 and the second contact electrode 32 are made of conductive material, which can be the same material as the source 21 and the drain 24. Furthermore, a buffer layer 33 is further disposed on the second substrate 30, and the first contact electrode 31 and the second contact electrode 32 are disposed on the buffer layer 33. Specifically, the first substrate 10 and the second substrate 30 may be glass substrates or flexible substrates made of high molecular polymers, and the high molecular polymers may be polyimide (PI). The buffer layer 33 can be silicon oxide layers (SiOx), silicon nitride layers (SiNx) or composite layers superimposed with the silicon oxide layers and the silicon nitride layers.

Furthermore, a first driving signal line 50 is prepared on the second substrate 30. The first driving signal line 50 is electrically connected to the second contact electrode 32. Preferably, the first driving signal line 50 is employed to provide a voltage driving signal (VDD). Specifically, the first driving signal line 50 provides the voltage driving signal (VDD) to the drain 24 of the thin film transistor 20 through the second contact electrode 32.

Furthermore, a second driving signal line 60 is prepared on the second substrate 30, and the second driving signal line 60 is electrically connected to the second electrode 42. Preferably, the second driving signal line 60 is employed to provide a power switch signal (VSS) to the second electrode 42 of the LED 40.

S30, aligning the first substrate 10 and the second substrate 30 to form the display panel.

In the embodiment of the present application, the first contact electrode 31 and the second contact electrode 32 on the second substrate 30 are respectively electrically connected to the source 21 and the drain 24 on the first substrate 10 to complete the manufacture of the display panel. Both the first contact electrode 31 and the second contact electrode 32 are made of conductive material, which can be the same material as the source 21 and the drain 24.

The embodiment of the present application provides a display panel and a manufacturing method thereof. The display panel comprises a first substrate 10 and a second substrate 30, and the first substrate 10 is provided with a driving circuit 20; the second substrate 30 is arranged corresponding to the first substrate 10, and an LED 40 is provided on a side of the second substrate 30 facing the first substrate 10. The driving circuit 20 is employed to drive the LED 40 to emit light. In the display panel provided by the present application, the thin film transistor 20 is arranged on the first substrate 10, and the power line and the LED 40 are arranged on the second substrate 30. The source 21 and the drain 24 of the thin film transistor 20 are electrically connected to the first contact electrode 31 and the second contact electrode 32 on the second substrate 30 corresponding thereto, to realize the separate arrangement of the power line and other thin metal line signal lines to improve the stability of the display signal, and solve the abnormal display problem caused by the voltage drop when the power supply passes through the thin film transistor 20.

The display panel and the manufacturing method thereof provided by the embodiments of the present application are described in detail as aforementioned, and the principles and implementations of the present application have been described with reference to specific illustrations. The description of the foregoing embodiments is merely for helping to understand the technical solutions of the present application and the core ideas thereof; meanwhile, those skilled in the art will be able to change the specific embodiments and the scope of the application according to the idea of the present application. In conclusion, the content of the specification should not be construed as limiting the present application.

What is claimed is:

1. A display panel, comprising:

a first substrate, wherein the first substrate is provided with a driving circuit, and the driving circuit comprises a thin film transistor and a scan signal line, and the thin film transistor comprises a gate, a source and a drain, and the scan signal line is electrically connected to the gate;

a second substrate, wherein the second substrate is arranged corresponding to the first substrate, and a first contact electrode, a second contact electrode and an LED is provided on a side of the second substrate facing the first substrate, and the first contact electrode is electrically connected with the source, and the second contact electrode is electrically connected with the drain, and the driving circuit is employed to drive the LED to emit light.

2. The display panel according to claim 1, wherein the second substrate further comprises a first driving signal line, electrically connected to the second contact electrode.

3. The display panel according to claim 1, wherein the LED comprises a first electrode, and the first electrode is electrically connected to the first contact electrode.

4. The display panel according to claim 3, wherein the LED further comprises a second electrode; the second substrate further comprises a second driving signal line, and the second driving signal line is electrically connected to the second electrode.

5. The display panel according to claim 4, wherein the first electrode and the second electrode are arranged on a same side.

6. The display panel according to claim 2, wherein the first substrate further comprises a third drive signal line, one end of the third drive signal line is electrically connected to the drain, and the other end of the third drive signal line is electrically connected to the first drive signal line.

7. A display panel, comprising:

a first substrate, wherein the first substrate is provided with a driving circuit;

a second substrate, wherein the second substrate is arranged corresponding to the first substrate, and an LED is provided on a side of the second substrate facing the first substrate, and the driving circuit is employed to drive the LED to emit light;

wherein the driving circuit comprises a thin film transistor, and the thin film transistor comprises a gate, a source and a drain;

the second substrate is provided with a first contact electrode and a second contact electrode, the first contact electrode is electrically connected with the source, and the second contact electrode is electrically connected with the drain.

8. The display panel according to claim 7, wherein the second substrate further comprises a first driving signal line, electrically connected to the second contact electrode.

9. The display panel according to claim 7, wherein the LED comprises a first electrode, and the first electrode is electrically connected to the first contact electrode.

10. The display panel according to claim 9, wherein the LED further comprises a second electrode; the second substrate further comprises a second driving signal line, and the second driving signal line is electrically connected to the second electrode.

11. The display panel according to claim 10, wherein the first electrode and the second electrode are arranged on a same side.

12. The display panel according to claim 8, wherein the first substrate further comprises a third drive signal line, one end of the third drive signal line is electrically connected to the drain, and the other end of the third drive signal line is electrically connected to the first drive signal line.

13. The display panel according to claim 7, wherein the first substrate further comprises a scan signal line, and the scan signal line is electrically connected to the gate.

14. A manufacturing method of a display panel, comprising steps of:

preparing a driving circuit on a first substrate;

preparing an LED on a second substrate, wherein the driving circuit is employed to drive the LED to emit light;

aligning the first substrate and the second substrate to form the display panel;

wherein the driving circuit comprises a thin film transistor, and the thin film transistor comprises a gate, a source and a drain;

a first contact electrode and a second contact electrode is prepared on the second substrate, the first contact electrode is electrically connected with the source, and the second contact electrode is electrically connected with the drain.

15. The manufacturing method according to claim 14, wherein a first driving signal line is prepared on the second substrate, electrically connected to the second contact electrode.

16. The manufacturing method according to claim 14, wherein the LED comprises a first electrode, and the first electrode is electrically connected to the first contact electrode.

17. The manufacturing method according to claim 16, wherein the LED further comprises a second electrode; a second driving signal line is prepared on the second substrate, and the second driving signal line is electrically connected to the second electrode.

18. The manufacturing method according to claim 17, wherein the first electrode and the second electrode are arranged on a same side.

* * * * *